(12) United States Patent
Ito

(10) Patent No.: US 7,385,280 B2
(45) Date of Patent: Jun. 10, 2008

(54) ELECTRONIC DEVICE PACKAGE AND ELECTRONIC EQUIPMENT

(75) Inventor: Wataru Ito, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/256,594

(22) Filed: Oct. 21, 2005

(65) Prior Publication Data
US 2006/0097373 A1 May 11, 2006

(30) Foreign Application Priority Data

| Nov. 11, 2004 | (JP) | .............................. 2004-327710 |
| Nov. 11, 2004 | (JP) | .............................. 2004-327711 |
| Jul. 13, 2005 | (JP) | .............................. 2005-204230 |

(51) Int. Cl.
*H01L 23/02* (2006.01)

(52) U.S. Cl. ............................. 257/679; 257/E26.064

(58) Field of Classification Search .................. 257/679
See application file for complete search history.

(56) References Cited

U.S. PATENT DOCUMENTS

| 5,474,958 | A   | * | 12/1995 | Djennas et al. ................ 29/827 |
| 6,255,599 | B1  |   | 7/2001  | Chang et al. |
| 6,259,158 | B1  | * | 7/2001  | Usami ......................... 257/724 |
| RE37,637  | E   | * | 4/2002  | Clifton et al. ............... 257/679 |
| 6,583,032 | B1  | * | 6/2003  | Ishikawa et al. ............ 438/462 |
| 6,729,888 | B2  |   | 5/2004  | Imaeda |
| 6,829,149 | B1  | * | 12/2004 | Chang et al. ................ 361/771 |
| 2002/0180010 | A1 | * | 12/2002 | Tsubosaki et al. .......... 257/667 |
| 2002/0190397 | A1 | * | 12/2002 | Kim ........................... 257/796 |
| 2005/0078099 | A1 | * | 4/2005  | Amundson et al. ......... 345/204 |

FOREIGN PATENT DOCUMENTS

| JP | 02-198896 | 8/1990 |
| JP | 07-193174 | 7/1995 |
| JP | 11-317067 | 11/1999 |
| JP | 2001-230001 | 8/2001 |
| JP | 2004-055937 | 2/2004 |

* cited by examiner

*Primary Examiner*—Leonard Andujar
*Assistant Examiner*—Krista Soderholm
(74) *Attorney, Agent, or Firm*—Harness, Dickey & Pierce, P.L.C.

(57) ABSTRACT

An electronic device to be loaded on an electronic equipment or an electronic component is mounted on a mount substrate, the mount substrate being made thin and flexible and having strong resistance to bending. An electronic device package including: a flexible substrate having a wiring pattern formed thereon; and an electronic device having a terminal formation face on which a connection terminal is provided, wherein the connection terminal is electrically connected directly or via a conductive member to the wiring pattern, and the terminal formation face is substantially aligned in a neutral plane of bending in a thickness direction of the electronic device package.

13 Claims, 6 Drawing Sheets

ELECTRONIC DEVICE PACKAGE AND ELECTRONIC EQUIPMENT

BACKGROUND OF THE INVENTION

1. Field of the Invention

This invention relates to an electronic device package and an electronic equipment.

Priority is claimed on Japanese Patent Application No. 2005-204230, filed Jul. 13, 2005, Japanese Patent Application No. 2004-327710, filed Nov. 11, 2004, and Japanese Patent Application No. 2004-327711, filed Nov. 11, 2004, the contents of which are incorporated herein by reference.

2. Description of Related Art

Recently, starting with card-sized electronic equipment, various types of electronic equipment are becoming thinner and lighter. As electronic equipment become thinner and lighter, there is a demand for various types of electronic devices mounted thereon to be mounted in a thin state. Taking a silicon IC chip (semiconductor chip) as an example of an electronic device, it is recently becoming possible to cut away the rear face while it is in the silicon wafer state and form an ultra-thin IC chip having a thickness of less than 50 μm.

Conventional methods for electrically connecting such an electronic device to a substrate which it is mounted on include methods using anisotropic conductive materials (ACF and ACP) and methods using wire bonding (WB). However, in methods using anisotropic conductive materials, the anisotropic conductive material adds substantially 10 μm to 30 μm to the thickness, and accordingly increases the thickness of the electronic equipment and electronic components which the device is mounted on. Methods using wire boding require a space of more than 1 mm for extracting the wire, and consequently increase the thickness of the electronic equipment and electronic components which the device is mounted on.

Therefore, these conventional methods are insufficient for reducing the thickness and weight of the electronic equipment and their electronic components. In particular, when these methods are applied in the ultra-thin IC mentioned above, there is a danger that ultrasonic waves and pressure when connecting may destroy the ultra-thin IC chip and reduce the reliability of the connection.

Against such a background, conventional mounting methods have been proposed for using an elastic conductive member to electrically connect terminals and increase the reliability of the connection structure (see for example Japanese Unexamined Patent Application, First Publication No. 2001-230001).

However, the conventional mounting method described in the above Patent Application is not sufficiently resistant to bending of the electronic device package, and consequently has a problem of poor reliability when used repeatedly.

When the thickness of an IC chip is reduced to substantially 50 μm, in addition to the thickness of the chip itself, minute blemishes caused during the manufacturing process may damage the semiconductor chip. For these reasons, it is desirable to increase bend-resistance near the chip.

SUMMARY OF THE INVENTION

The present invention has been realized in consideration of the above points, and an object thereof is to provide an electronic device package for mounting an electronic device to be loaded on electronic equipment and electronic components, it being possible to make the electronic device package thin and flexible so that it has high resistance to bending.

To achieve the above objects, the present invention provides An electronic device package including: a flexible substrate having a wiring pattern formed thereon; and an electronic device having a terminal formation face on which a connection terminal is provided, wherein the connection terminal is electrically connected directly or via a conductive member to the wiring pattern, and the terminal formation face is substantially aligned in a neutral plane of bending in a thickness direction of the electronic device package.

Since the electronic device package uses a flexible substrate as its basic structure, it is flexible and can be bent comparatively freely. Since the electronic device is mounted such that the terminal formation face of the electronic device substantially matches the neutral plane of the electronic device package, there is almost no strain in the terminal formation face of the electronic arranged in alignment with the neutral plane when the electronic device package is bent. There are consequently no effects of bending stress on the point where the terminal formation face of the electronic device is electrically connected to the wiring pattern on the electronic device package. Therefore, the electronic device package has excellent resistance to bending and superior reliability.

In the electronic device package of this invention, a first component group including the flexible substrate and arranged on one side of the terminal formation face in the thickness direction of the electronic device package; and a second component group including the electronic device and arranged on the other side of the terminal formation face, wherein a modulus of elasticity in bending of the first component group and a modulus of elasticity in bending of the second component group are substantially the same.

Since the position of the neutral plane corresponds to the position where the modulus of elasticity in bending in the thickness direction of the electronic device package balance out, this configuration enables the terminal formation face to be matched with the neutral plane.

In another arrangement, the electronic device is mounted with the terminal formation face facing the flexible substrate, and a modulus of elasticity in bending of the electronic device is substantially equal to a combined modulus of elasticity in bending of the flexible substrate and components of the first component group provided between the flexible substrate and the terminal formation face.

When the electronic device is mounted with its terminal formation face facing the substrate side (bottom side), the modulus of elasticity in bending of the electronic device itself can be made substantially equal to the modulus of elasticity in bending of the components on the side of the substrate where the electronic device is-mounted (e.g. the laminated body including of the flexible substrate and the insulating layer formed thereon), enabling the terminal formation face to be substantially matched with the neutral plane.

In yet another arrangement, a conductor post formed on the wiring pattern and protruding toward the electronic device; and an adhesive layer surrounding the conductor post, and disposed between the electronic device and the flexible substrate, wherein the connection terminal of the electronic device is electrically connected to the conductor post.

According to this configuration, the electronic device can be mounted on the substrate without using an anisotropic conductive film (ACF), an anisotropic conductive paste (ACP), or such like. In particular, if the conductor post is made by sintering of fine metal particles, the electronic device is less likely to suffer damage and the like at the time of mounting, and a satisfactory connection can be obtained between the connection terminal and the wiring pattern.

Preferably, an insulating layer is formed on the flexible substrate and in a region outside the electronic device, and covers the wiring pattern. According to this configuration, the insulating layer protects the wiring pattern and improves the reliability of the electronic device package.

In the electronic device package of this invention, it is preferable that the insulating layer is also formed on the electronic device. This configuration enables the electronic device to be protected by the insulating layer, effectively preventing the electronic device from disconnection and the like.

In another possible arrangement of the electronic device package of this invention, further including: an insulating layer covering the electronic device; a first component group including the flexible substrate and the electronic device and arranged on one side of the terminal formation face in the thickness direction of the electronic device package; and a second component group including the insulating layer and arranged on the other side of the terminal formation face, wherein the electronic device is mounted with the terminal formation face facing opposite to the flexible substrate, and a modulus of elasticity in bending of the first component group and a modulus of elasticity in bending of the second component group are substantially the same. The modulus of elasticity in bending of the insulating layer formed on the electronic device is substantially equal to the combined modulus of elasticity in bending of the electronic device, the flexible substrate, and components provided between the electronic device and the flexible substrate. The terminal formation face of the electronic device may be arranged such that it faces the opposite side to that of the flexible substrate. In this case, since the main body of the electronic device and the flexible substrate are arranged on the flexible substrate side of the terminal formation face, the neutral plane can be matched with the terminal formation face by matching the modulus of elasticity in bending of the insulating layer provided on the electronic device with the combined modulus of elasticity in bending of the electronic device and the flexible substrate.

Preferably, in the electronic device package of this invention, a slope member formed on a side face of the electronic device, and having a sloping face which extends outwardly from the side face; and a connection wiring directly contacting the sloping face of the slope member, wherein the connection terminal and the wiring pattern are electrically connected via the connection wiring.

According to this configuration, the slope member can alleviate the step between the terminal formation face of the electronic device which is mounted on the flexible substrate and the top face of the flexible substrate. Therefore, a connection wiring can be extracted from the connection terminal via the sloping face of the slope member to the wiring pattern, and the mount structure of the electronic device can be made thin.

In the electronic device package of this invention, a neutral plane of bending of the electronic device package in an outer side of the electronic device in a thickness direction of the electronic device package is substantially aligned in a single plane with the terminal formation face. That is, the neutral plane should also preferably be aligned in a single face with the terminal formation face of the electronic device in the outer side of the region where the electronic device is mounted. There is consequently no change in the transistor characteristics due to bend stress, and excellent connection reliability is obtained.

In the electronic device package of this invention, the thickness of the electronic device should preferably be less than 50 μm. This configuration ensures that the overall electronic device package has good flexibility.

The present invention also provides a method for manufacturing the electronic device package described above. This manufacturing method includes: forming a connection wiring layer containing a wiring pattern on the flexible substrate, using a droplet ejection method to arrange a liquid body containing fine metal particles on the wiring pattern and/or on the connection terminal of the electronic device, connecting the wiring pattern to the connection terminal via the liquid body, drying the liquid body to form a conductor, and making the wiring pattern and the connection terminal electrically conductive. According to this manufacturing method, the liquid body between the connection portion of the wiring pattern and the connection terminal of the electronic device is baked and the fine metal particles are sintered, thereby connecting the connection portion of the wiring pattern to the connection terminal of the electronic device and making them electrically conductive. Therefore, the thickness required for connection and conduction is the extremely thin thickness of the sintered compact of the fine metal particles, and the obtained mount structure can be made thinner. It also becomes possible to maintain conduction between the connection portion and the terminal basically without applying pressure to the electronic device, so that even an ultra-thin semiconductor chip can for example be mounted without applying pressure thereto. This avoids trouble such as reduced connection reliability and breakage of the semiconductor chip due to application of pressure. The bend characteristics and connection reliability of the electronic device package thus obtained can be maintained.

In the method for manufacturing the electronic device package according to this invention, a conductor post should preferably be provided on the wiring pattern and/or on the connection terminal by arranging the liquid body on the wiring pattern and/or on the connection terminal. This conductor post obtains an advantage of making it easier to align the electronic device when mounting it.

Preferably in the method for manufacturing the electronic device package of this invention, the electronic device is mounted on the flexible substrate by forming an adhesive layer that covers the wiring pattern while exposing the conductor post, and then mounting the electronic device onto the adhesive layer. This manufacturing method obtains excellent connection characteristics between the electronic device and the flexible substrate, and improve the reliability of the electronic device package thus obtained. Furthermore, since the top face of the conductor post is exposed when forming the adhesive layer, the connection terminal of the electronic device can be easily aligned with the conductor post, making manufacture accurate and easy.

To achieve the objectives mentioned above, this invention provides An electronic device package including: a flexible substrate having a wiring pattern formed thereon; and an electronic device having a terminal formation face on which a connection terminal is provided, wherein the electronic device has a mount face on an opposite side of the terminal formation face of the electronic device, the electronic device is arranged with the terminal formation face facing opposite to the flexible substrate, and the mount face is substantially aligned in a neutral plane of bending in a thickness direction of the electronic device package.

Since the electronic device package uses a flexible substrate as its basic structure, it is flexible and can be bent comparatively freely. Since the electronic device is mounted such that the terminal formation face of the electronic device substantially matches the neutral plane of the electronic device package, there is almost no strain in the terminal formation face of the electronic arranged in alignment with the neutral plane when the electronic device package is bent. There are consequently no effects of bending stress on the point where the terminal formation face of the electronic device is electrically connected to the wiring pattern on the electronic device package. Consequently, in the mount face where there is a possibility of minute cracks (grind cracks) being created at the time of grinding, damage caused by expansion of grind cracks and the like can be prevented, obtaining an electronic device package which is resistant to bending and has excellent reliability.

Preferably in the electronic device package of this invention, a first component group including the flexible substrate and arranged on one side of the mount face in the thickness direction of the electronic device package; and a second component group including the electronic device and arranged on the other side of the mount face, wherein a modulus of elasticity in bending of the first component group and a modulus of elasticity in bending of the second component group are substantially the same. Since the position of the neutral plane corresponds to the position where the modulus of elasticity in bending in the thickness direction of the electronic device package balance out, this configuration enables the terminal formation face to be matched with the neutral plane.

In the electronic device package of this invention, an insulating layer arranged on the flexible substrate and in a region outside the electronic device, wherein the insulating layer covers the wiring pattern. According to this configuration, the wiring pattern is protected by the insulating layer, increasing the reliability of the electronic device package.

In the electronic device package of this invention, a neutral plane of bending of the electronic device package in an outer side of the electronic device in a thickness direction of the electronic device package is substantially aligned in a single plane with the mount face.

In the electronic device package of this invention, the insulating layer may also be formed on the electronic device. According to this configuration, the insulating layer protects the electronic device and effectively prevents it from becoming disconnected and so on.

Preferably in the electronic device package of this invention, a slope member formed on a side face of the electronic device, and having a sloping face which extends outwardly from the side face; and a connection wiring directly contacting the sloping face of the slope member, wherein the connection terminal and the wiring pattern are electrically connected via the connection wiring.

According to this configuration, the slope member can alleviate the step between the terminal formation face of the electronic device which is mounted on the flexible substrate and the top face of the flexible substrate. Therefore, a connection wiring can be extracted from the connection terminal via the sloping face of the slope member to the wiring pattern, and the mount structure of the electronic device can be made thin.

In the electronic device package of this invention, the thickness of the electronic device should preferably be less than 50 μm. This configuration ensures that the overall electronic device package has good flexibility.

The method for manufacturing an electronic device package of this invention is a method for manufacturing an electronic device package including of an electronic device which is mounted on a flexible substrate and has a terminal formation face which a connection terminal is fitted to. This manufacturing method includes: mounting the electronic device on the flexible substrate with an adhesive layer therebetween, forming a slope member on a side face of the electronic device, the slope member having a sloping face which extends from the terminal formation face onto the flexible substrate, and electrically connecting the connection terminal to the wiring pattern via the top face of the sloping face of the slope member. The modulus of elasticity in bending of the components arranged on each side of the mount face of the electronic device are made substantially equal.

An electronic equipment of this invention incorporates the electronic device package described above. According to this configuration, the thin and flexible electronic device package which has excellent electrical connection reliability enables the electronic equipment to be made thin and reliable.

BRIEF DESCRIPTION THE DRAWINGS

DETAILED DESCRIPTION OF THE INVENTION

Embodiments of the present invention will be explained with reference to the drawings.

First Embodiment

Figure 1:
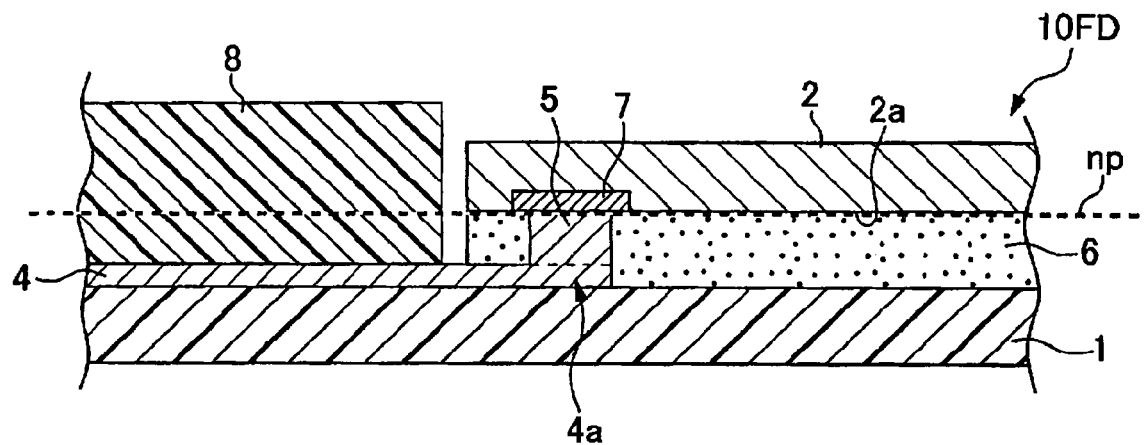
FIG. 1 is a partial cross-sectional structural view of an electronic device package according to a first embodiment.

FIG. 1 is a partial cross-sectional structural view of a first embodiment of an electronic device package of this invention. As shown in FIG. 1, an electronic device package 10 FD includes a semiconductor chip (an electronic device having a connection terminal on one face) 2 which is mounted on a flexible substrate 1. Since the flexible substrate 1 consists of a resin such as polyimide, various shapes may be used such as a tape-like or a sheet-like shape.

A metal wiring pattern 4 is formed on the flexible substrate 1. Since this metal wiring pattern 4 is formed by using a metal wiring formed on the flexible substrate or a droplet ejection method that will be explained below, it is formed from a sintered compact of fine metal particles such as fine silver particles. The metal wiring pattern 4 connects to an unillustrated wiring on the end edge of the flexible substrate 1 and is connected to another external terminal (unillustrated) via this wiring. The end of the metal wiring pattern 4 on the center side of the flexible substrate 1 forms a connection section 4a that connects to a terminal of the semiconductor chip 2, and a conductor post-shaped conductor post 5 having a height of substantially several tens of μm is formed on top of the connection section 4a.

The conductor post 5 is made by a droplet ejection method, and is formed from a sintered compact of fine metal particles such as fine silver particles.

An adhesive layer 6 of thermosetting insulating resin is formed on the flexible substrate 1. The adhesive layer 6 covers the metal wiring pattern 4 with the top face of the conductor post 5 exposed as explained later, thereby affixing the flexible substrate 1 to the semiconductor chip 2. For example, an epoxy resin material or the like is used as the thermosetting resin for forming the adhesive layer 6.

The semiconductor chip 2 is affixed onto the adhesive layer 6 with its terminal formation face (active face) 2a facing the side of the flexible substrate 1. Since the semiconductor chip 2 is ultra-thin, having a thickness of less than 50 μm in this embodiment, it is mounted with a pad (connection terminal) 7 thereof facing the side of the flexible substrate 1. In other words, it is mounted by facedown bonding. The pad 7 of the semiconductor chip 2 is formed, for example, by plating of Ni and Au in that sequence on an unillustrated base layer of an aluminum alloy extracted from an unillustrated integrator circuit inside the semiconductor chip 2. Ag, Cu, Sn, and In, can be used instead of Au for the outermost layer (uppermost layer) which becomes the actual join layer of the pad 7; a laminated layer structure consisting of a plurality of the above may also be used.

The pad 7 directly contacts the conductor post 5 and is connected to it to form a conductive connection structure with the metal wiring pattern 4. Since the pad 7 is connected to the metal wiring pattern 4 with the conductor post 5 in between, and the bottom face of the semiconductor chip 2 is connected to the flexible substrate 1 with the adhesive layer 6 in between, the semiconductor chip 2 is securely attached to the flexible substrate 1.

An insulating layer 8 consists of an organic insulating material such as acrylic resin or epoxy resin, and covers the metal wiring pattern 4 in the region outside the semiconductor chip 2. The insulating layer 8 functions as a so-called passivation film which protects the metal wiring pattern 4, preventing short-circuiting of the metal wiring pattern 4 due to contact with an external part, erosion of the metal wiring pattern 4 caused by environmental water and reactive gas, and so on. The insulating layer 8 may deposited such that it covers not only the metal wiring pattern 4 but also the surface of the semiconductor chip 2. In other words, the semiconductor chip 2 may be sealed between the insulating layer 8 and the flexible substrate 1. In this case, the insulating layer 8 also prevents the semiconductor chip 2 from being damaged or disconnected.

The electronic device package 10 FD of this embodiment configured as described above consists of the thin-film semiconductor chip 2 mounted on a flexible substrate 1 and can appropriately be used in, for example, attaching to an electronic equipment when bent into a cross-sectional U-shape, and in a controller for a display apparatus having variable electronic parameters and the like, and so on. As shown in FIG. 1, in the electronic device package 10 FD of this embodiment, the neutral plane (the plane in which the strain ε becomes zero when a bending stress is applied to the electronic device package 10 FD) np substantially matches the terminal formation face 2a of the semiconductor chip 2. That is, the modulus of elasticity in bending of the structural members (the flexible substrate 1, the semiconductor chip 2, the adhesive layer 6, and so on) which are arranged on both sides of the combustion chamber 2a in the thickness direction of the electronic device package 10 FD are adjusted to make them substantially equal. Due to this configuration, in the electronic device package 10 FD of this embodiment there is almost no strain at the connection portion between the semiconductor chip 2 and the conductor post 5 when the substrate is bent. Therefore, there is no change in transistor characteristics due to strain, and loss of electrical connection at the connection portion can be effectively prevented. This obtains a highly reliable electronic device package having excellent bend resistance.

The abovementioned modulus of elasticity in bending expresses the modulus of elasticity which is measured using a load-displacement curve determined in a three-point flexure test, and is calculated by the Equation (1). In the Equation (1), L is the distance between fulcrums (support rolls), w is the width of the test piece, t is the thickness of the test piece, F is a load which is arbitrarily selected from the elastic deformation region of the load-displacement curve, and Y is the displacement at the load F. In the Equation (1), the load F may be the difference (P1−P2) between loads at two points P1 and P2, and Y may be the difference between two displacements (y1−y2) corresponding to the loads P1 and P2.

$$Eb = L^3 F / 4\, wt^3 Y \tag{1}$$

In the case of the electronic device package 10 FD shown in FIG. 1, the modulus of elasticity in bending of the laminated structure consisting of the adhesive layer 6 and the flexible substrate 1 arranged on the lower side of the terminal formation face 2a as viewed in the diagram, and the modulus of elasticity in bending of the semiconductor chip 2, are adjusted so that they are almost equal. The modulus of elasticity in bending can be adjusted by adjusting the Young modulus and the thickness of the flexible substrate 1. In this embodiment, effects of the modulus of elasticity in bending can be almost completely eliminated if the metal wiring pattern 4 is formed by a droplet ejection method, since its film thickness can thereby be made extremely thin.

In the electronic device package 10 FD of this embodiment, in the outer side region of the semiconductor chip 2, the neutral plane of the electronic device package should preferably be aligned in a single plane with the terminal formation face 2a of the semiconductor chip 2. This is due to the fact that if the neutral plane position differs according to the area on the electronic device package, the displacement varies according to the area when the electronic device package is bent, making it impossible to obtain uniform bend characteristics and leading to the danger of a large load being locally applied.

As shown in FIG. 1, in the region outside the semiconductor chip 2, the metal wiring pattern 4 and the insulating layer 8 are laminated on the flexible substrate 1, and the neutral plane np aligned in a single plane with the terminal formation face 2a is positioned within the insulating layer 8. Therefore, the modulus of elasticity in bending for adjusting the position of the neutral plane can be adjusted by adjusting the thickness of the insulating layer 8.

As described above, since the electronic device package 10 FD of this embodiment has a neutral plane which substantially matches the terminal formation face 2a of the semiconductor chip 2, there is almost no strain in the terminal formation face 2a when the substrate is bent. The electronic device package 10 FD consequently has excellent resistance to bend stress at the connection portion of the semiconductor chip 2 and the metal wiring pattern 4, and is therefore highly reliable.

Second Embodiment

Figure 2:
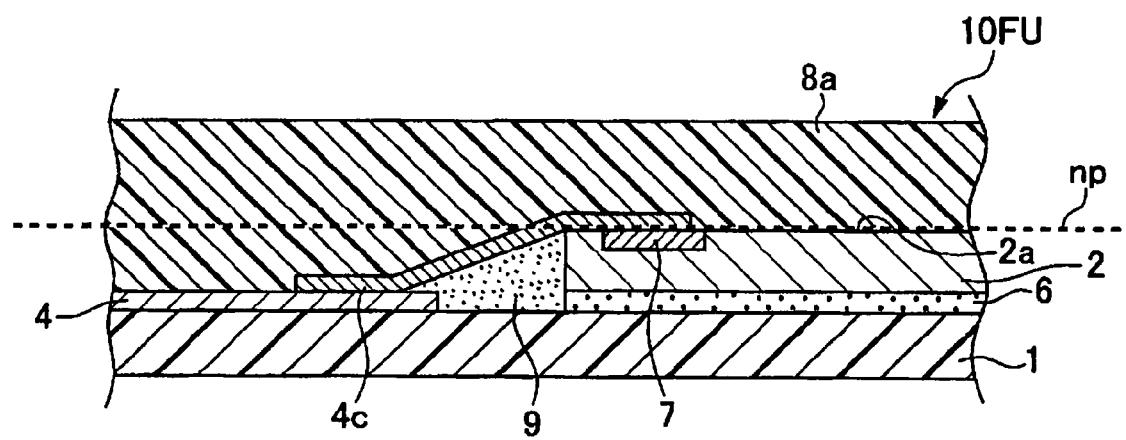
FIG. 2 is a partial cross-sectional structural view of an electronic device package according to a second embodiment.

The configuration of electronic device package according to a second embodiment of this invention will be explained with reference to FIG. 2. FIG. 2 is a partial cross-sectional structural view of the electronic device package according to the second embodiment.

Other than the differences in the mount structure of the semiconductor chip 2 that constitutes the electronic device, the structure of the electronic device package 10 FU of this embodiment is the same as that of the electronic device package 10 FD in the first embodiment described above. For this reason, repetitious explanation of constituent elements in FIG. 2 which are indicated by the same reference numerals as those in FIG. 1 will be omitted.

The electronic device package 10 FU shown in FIG. 2 is produced by depositing the metal wiring pattern 4 on the metal wiring pattern 4, and then mounting the semiconductor chip 2 on top with the adhesive layer 6 in between. The semiconductor chip 2 is affixed to the flexible substrate 1 by facedown bonding with its terminal formation face 2a facing the opposite side to the flexible substrate 1.

A slope member 9 is formed on a side face portion of the semiconductor chip 2, and has a sloping portion extending outwardly from the terminal formation face 2a to the top of the flexible substrate 1. A connection wiring 4c electrically connects the pad 7 to the metal wiring pattern 4 via the top face of the sloping portion of the slope member 9. The connection wiring 4c is formed by a droplet ejection method, and consists of a thin film made by sintering of fine metal particles. The slope member 9 alleviates the step between the terminal formation face 2a of the semiconductor chip 2 and the top face of the flexible substrate 1, and also prevents breakage and the like of the connection wiring 4c which is formed by a droplet ejection method.

The slope member 9 can be formed by using a liquid application means such as a dispenser to coat the top of the flexible substrate 1 with a resin material such as, for example, polyimide resin, silicon-modified polyimide resin, epoxy resin, silicon-modified epoxy resin, benzocyclobutene (BCB), and polybenzoxazole (PBO). Alternatively, it may be formed by droplet ejection or by affixing a dry film.

An insulating layer 8a consisting of an organic-insulating material such as acrylic resin or epoxy resin is deposited over the semiconductor chip 2, the metal wiring pattern 4, the connection wiring 4c, and the like, on the flexible substrate 1. As shown in FIG. 2, the film thickness of the insulating layer 8a differs on the semiconductor chip 2 and the outer side region thereof; in this embodiment, the insulating layer 8a is thin on the semiconductor chip 2 and thick on the outside side of the semiconductor chip 2.

In the electronic device package 10 FU of this embodiment configured as described above, the modulus of elasticity in bending of the components are adjusted such that the terminal formation face 2a of the semiconductor chip 2 substantially matches the neutral plane np of the electronic device package 10 FU. In this embodiment, the flexible substrate 1, the adhesive layer 6, and the semiconductor chip 2 are arranged on the lower side of the terminal formation face 2a as viewed in the diagram, and only the insulating layer 8a if arranged on the upper side. Consequently, the neutral plane can be adjusted mainly by changing the material quality and/or adjusting the thickness of the insulating layer 8a.

Likewise in the electronic device package 10 FU of this embodiment, the neutral plane in the outer side region of the semiconductor chip 2 should preferably be aligned with the terminal formation face 2a of the semiconductor chip 2. The neutral plane in this region can similarly be adjusted by changing the material quality and/or adjusting the thickness of the insulating layer 8a.

In the electronic device package 10 FU of the second embodiment, since the terminal formation face 2a of the semiconductor chip 2 and the neutral plane np of the electronic device package substantially match, there is almost no strain in the join portion between the connection wiring 4c and the pad 7 when the electronic device package 10 FD is bent, obtaining excellent connection reliability. Also, since the connection wiring 4c is formed by a droplet ejection method, an electronic device can be mounted extremely thinly by comparison with wire bonding. This contributes greatly to thinning the electronic equipment which the electronic device package is mounted on.

Method for Manufacturing the Electronic Device Package

Next, a method for manufacturing the electronic device package 10 FD according to the first embodiment shown in FIG. 1 will be explained with reference to FIG. 3.

Figure 3A:
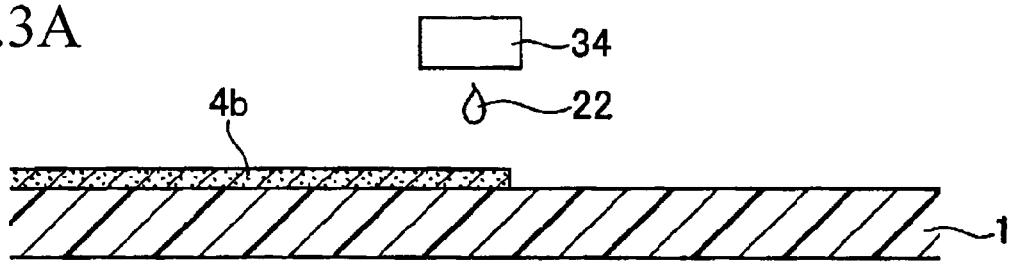
FIGS. 3A to 3D are cross-sectional structural views of a method for manufacturing the electronic device package according to the first embodiment.

Firstly, a droplet ejection method is used to eject a liquid substance, which is made by dispersion of fine metal particles into a dispersion liquid, at a predetermined position on a flexible substrate 1 such as that shown in FIG. 3A. While it is possible to use an inkjet method, a dispenser method, and such like, as the droplet ejection method, this embodiment uses the inkjet method which is preferable since it enables a desired amount of the liquid substance to be deposited at a desired position.

Figure 4A:
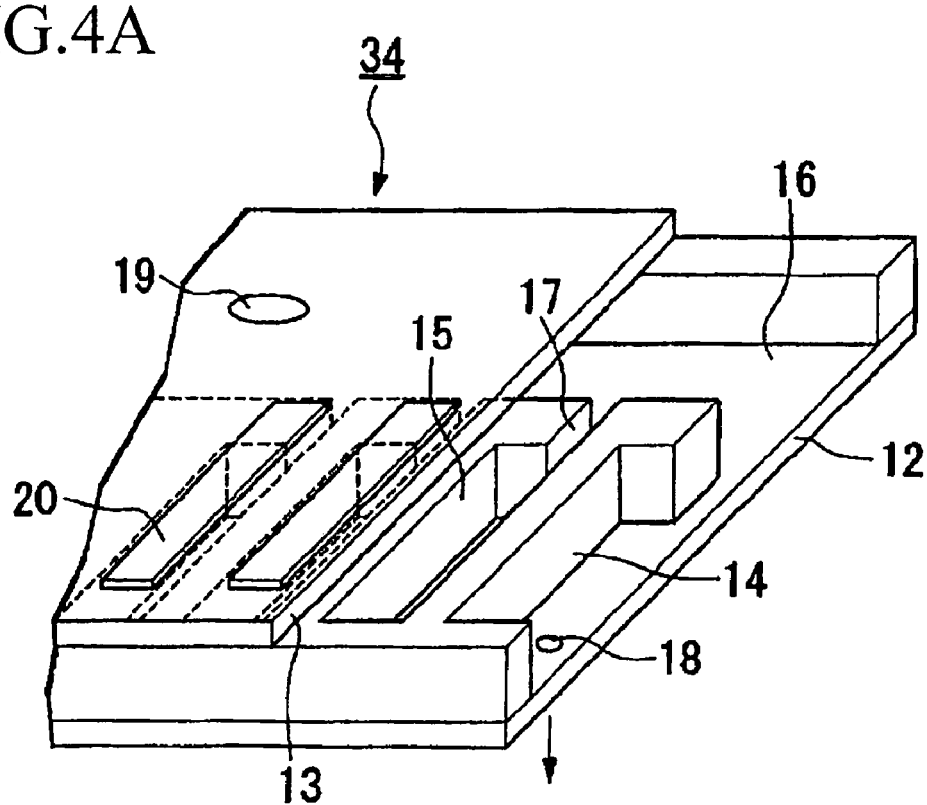
FIGS. 4A and 4B are views for explanation of a droplet ejection head.

A droplet ejection head (inkjet head) which is suitable for ejecting by the inkjet method will be explained. As shown in FIG. 4A, a droplet ejection head 34 consists of, for example, a stainless steel nozzle plate 12 and a vibration plate 13, which are joined together with a partition member (reverse plate) 14 between them. The partition member 14 forms a plurality of spaces 15 and a liquid holder 16 between the nozzle plate 12 and the vibration plate 13. The spaces 15 and the liquid holder 16 are filled with a liquid substance, and each space is connected to the liquid holder 16 by a supply opening 17. A plurality of nozzle holes 18 for ejecting the liquid substance from the spaces 15 are provided in the nozzle plate 12 in a matrix-like arrangement. One hole for supplying the liquid substance is provided in the vibration plate 13.

Figure 4B:
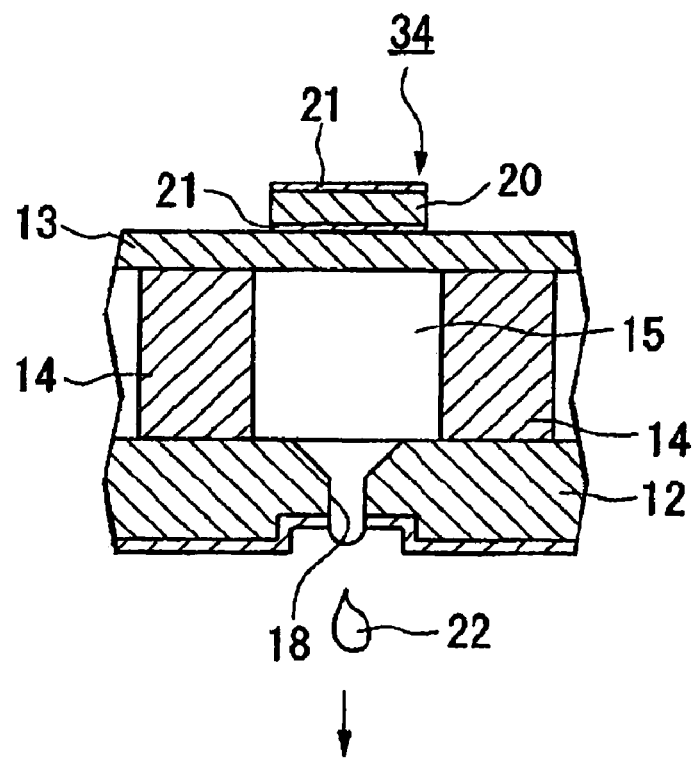

As shown in FIG. 4B, a piezoelectric element 20 is connected on opposite side of the vibration plate 13 to the one facing the space 15. The piezoelectric element 20 is provided between a pair of electrodes 21, and is flexible so that it protrudes outwardly when it conducts. The vibration plate 13 which this piezoelectric element 20 is connected to bends outwardly with it simultaneously, greatly increasing the capacity of the space 15. Therefore, the liquid substance entering from the liquid holder 16 through the supply aperture 17 corresponds to the increased capacity of the space 15. When conduction to the piezoelectric element 20 is cancelled, the piezoelectric element 20 and the vibration plate 13 return to their former shapes. As a consequence, the space 15 also returns to its former capacity, whereby a droplet 22 of the liquid substance (liquid body) inside the space 15 rises up and is ejected from the nozzle hole 18 toward the flexible substrate 1.

The liquid body used for ejecting can be made by dispersing a fine metal particles such as gold, silver, copper, palladium, and nickel, in a dispersion liquid. The surfaces of the fine metal particles can be coated with an organic material in order to enhance their dispersion characteristics. A polymer which induces steric hindrance and electrostatic repulsion is one example of a material which can be used to coat the surfaces of the fine metal particles. It is preferable that the particle diameter of the fine metal particles is greater than 5 nm and less than 0.1 μm. The reason for this is that, when the diameter is greater than 0.1 μm, the nozzle of the ejection head is liable to become blocked, making it difficult to eject using the inkjet method; and, when the diameter of the particles is less than 5 nm, the volume ratio of the coating material to the fine metal particles increases and the proportion of organic material in the film becomes excessive.

The dispersion liquid for dispersing the fine metal particles should preferably have vapor pressure of more than 0.001 mmHg and less than 200 mmHg (more than substantially 0.133 Pa and less than substantially 26600 Pa) at room temperature. The reason for this is that, when the vapor pressure is higher than 200 mmHg the liquid is abruptly vaporized after being ejected, making it difficult to form a satisfactory film (wiring film).

The vapor pressure of the dispersion liquid should preferably be higher than 0.001 mmHg and less than 50 mmHg (more than substantially 0.133 Pa and less than substantially 6650 Pa). If the vapor pressure is higher than 50 mmHg, dryness tends to nozzle blockage when droplets are ejected using the inkjet method (droplet ejection method), making it difficult to eject stably. On the other hand, when the vapor pressure of the dispersion liquid at room temperature is less than 0.001 mmHg, drying is delayed and the dispersion liquid tends to remain in the film, making it difficult to obtain a good-quality conductive film (wiring) after a subsequent heating process.

There are no particular limitations on the dispersion liquid used, which need only be capable of dispersing the fine metal particles without causing clumping thereof. In addition to water, examples of suitable dispersion liquids include: alcohol types such as methanol, ethanol, propanol, and butanol; hydrocarbon compounds such as n-heptane, n-octane, decane, tetradecane, decalin, toluene, xylene, cymene, durene, indene, dipentene, tetrahydro naphthalene, decahydro naphthalene, and cyclohexyl benzene; ether system compounds such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1- and 2-dimethoxyethane, bis(2-methoxyethyl) ether, p-dioxane; polar compounds such as propylene carbonate, y-butyrolactone, N-methyl-2-pyrrolidone, dimethyl formamide, dimethyl sulfoxide, cyclohexanone, and so on. Of these, with regard to the dispersion characteristics of the particles and the stability of the dispersion liquid, and the ease of applicability to the inkjet method, water, alcohol types, hydrocarbon compounds, and ether system compounds, are preferable. Dispersion liquids of water and hydrocarbon compounds are particularly preferable, since they can be used singly or as a mixture of two or more elements.

The dispersion concentration when dispersing the fine metal particles in the dispersion liquid (i.e. the density of the fine metal particles) is greater than 1 mass % and less than 80 mass %, and can be adjusted in accordance with the film thickness of the desired metal wiring pattern 4. At less than 1 mass %, a subsequent process of sintering by heating takes a long time. At more than 80 mass %, clumping is liable to occur and it becomes difficult to obtain an even film.

Preferably, the surface tension of the liquid body which is obtained by dispersing the fine metal particles into the dispersion liquid should be between 0.02 N/m and 0.07 N/m. At the time of ejecting the liquid body using the inkjet method, if its surface tension is less than 0.02 N/m, the wetness of the liquid with respect to the nozzle face increases and its flight is liable to bend. If the surface tension exceeds 0.07 N/m, the meniscus shape at the tip of the nozzle becomes unstable, making it difficult to control the ejection amount and the eject timing.

The viscosity of the liquid body should preferably be greater than 1 m Pa·s and less than 50 m Pa·s. When ejecting the liquid body by the inkjet method, if the viscosity if less than 1 m Pa·s, the periphery of the nozzle of the ejection head is liable to become polluted by the outward flow of the ink (liquid body). If the viscosity if greater than 50 m Pa·s, the nozzle holes tends to become blocked more frequently, making it difficult to eject the droplets smoothly.

In this embodiment, as shown in FIG. 3A, a droplet 22 of the liquid body made by using fine silver particles as the fine metal particles is ejected from the droplet ejection head 34 and dropped onto a point on the flexible substrate 1 where the wiring is to be formed, forming an intermediate structure 4b which will become the metal wiring pattern 4 after baking. In this embodiment, this intermediate structure 4b indicates the liquid dropped onto the substrate and the dry substance of this liquid. In the apparatus which ejects the liquid body, the amount of overlap between consecutively ejected droplets should preferably be controlled in order to prevent bulging. It is also possible to use an ejection method which separately ejects a plurality of droplets so that they do not touch each other in a first ejection, and then fills the gaps between them in second and subsequent ejections.

Figure 3B:
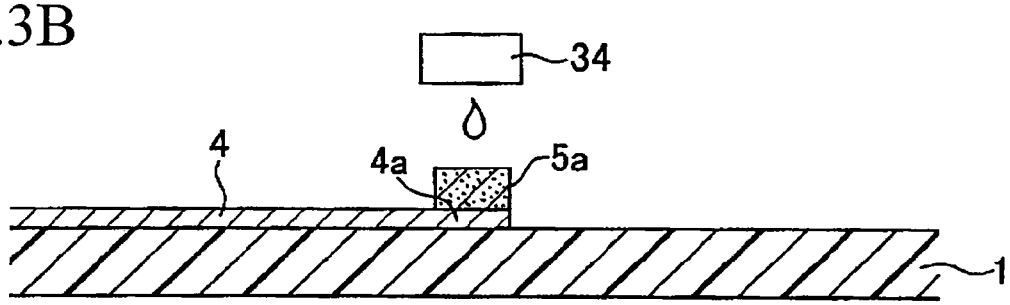

After the intermediate structure 4b of the metal wiring pattern 4 has been formed in this way, it is heated at substantially 200° C., and the fine metal particles (fine silver particles) are sintered to obtain the metal wiring pattern 4 shown in FIG. 3B. Incidentally, instead of the main curing process of sintering the fine metal particles (fine silver particles), the intermediate structure 4b of the metal wiring pattern 4 may be confined to a provisional curing process of merely vaporizing the dispersion liquid in the liquid body.

Next, on the connection section 4a of the metal wiring pattern 4 (i.e. the connection section 4a consisting of the end of the center side of the flexible substrate 1), the liquid body is ejected from the droplet ejection head 34 in a post shape in the same manner as when forming the metal wiring pattern 4, thereby forming an intermediate structure 5a of the conductor post 5. The intermediate structure 5a is then dried to preserve its post shape on the connection section 4a. This drying process can be performed by using methods such as heating at substantially several tens of ° C., blowing warm air or hot air using a dryer or the like, depressurization, and so on.

Figure 3C:
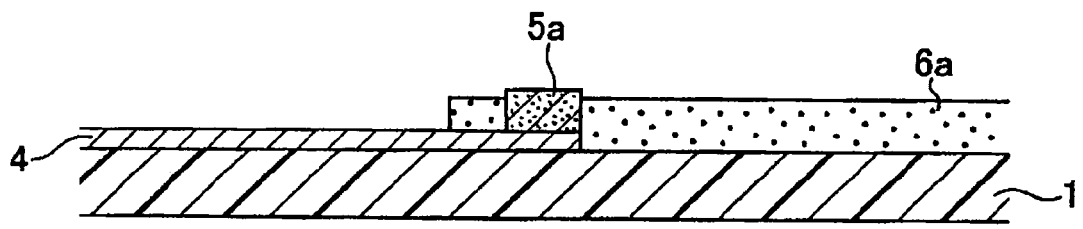

After the intermediate structure 5a of the conductor post 5 is dried, the abovementioned thermosetting resin is applied over the flexible substrate 1 with the metal wiring pattern 4 covered so as to form an uncured adhesive layer 6a as shown in FIG. 3C. There are no particular limitations on the method for applying the thermosetting resin, it being possible to use a conventional application method such as roll-coating, droplet ejection, and so on. When forming the adhesive layer 6a, the top face of the intermediate structure 5a of the conductor post 5 is left exposed.

Figure 3D:
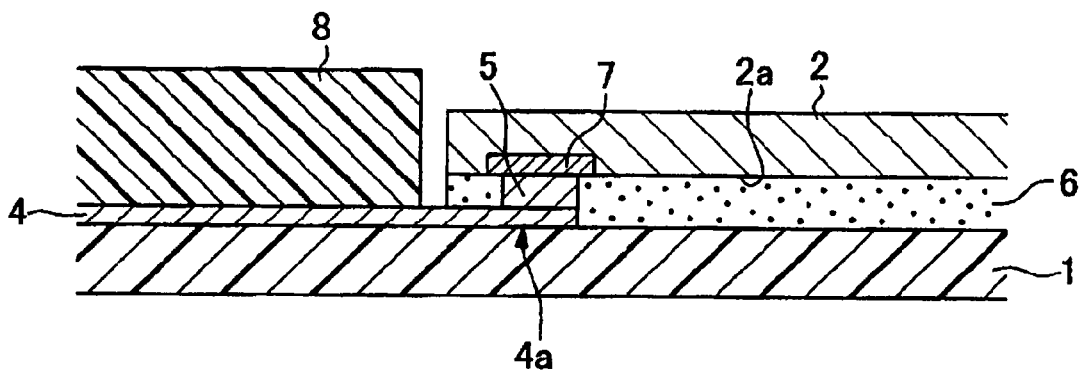

The semiconductor chip 2 is then positioned on the uncured adhesive layer 6a, and mounted with the pad 7 joined to the conductor post 5 as shown in FIG. 3D. At this time, the pad 7 is joined to the intermediate structure 5a of the conductor post 5 without applying pressure to the semiconductor chip 2 and using substantially only the pressure of its own weight. Since the intermediate structure 5a is in a provisional cured state, the semiconductor chip 2 is deposited extremely thinly, having a thickness of less than 50 μm, and despite being light is able to deform easily by the pressure of its own weight, ensuring satisfactory direct contact with the pad 7. Similarly, since the adhesive layer 6a is in an uncured state, it makes satisfactory direct contact with the bottom face of the semiconductor chip 2.

Thereafter, by heating at 200° C. for substantially two hours, the dry intermediate structure 5a is baked so as to sinter the fine metal particles (fine silver particles), obtaining the conductor post 5. The connection section 4a of the conductor post 5 becomes connected to the pad 7 of the semiconductor chip 2 via the conductor post 5, and becomes electrically conductive. Simultaneously, the adhesive layer 6a is cured to obtain the adhesive layer 6, and the bottom face of the semiconductor chip 2 is firmly attached to the flexible substrate 1 via the adhesive layer 6, obtaining the electronic device package 10 FD having the mount structure shown in FIG. 1.

When the intermediate structure 4b of the metal wiring pattern 4 is confined to a provisional curing process instead of the main curing process as described above, the fine metal particles of the connection section 4a are sintered by baking the intermediate structure 5a of the conductor post 5.

When manufacturing the electronic device package 10 FD obtained by the above processes, the neutral plane of the electronic device package 10 FD is made to substantially match the terminal formation face 2a of the semiconductor chip 2 by selecting/adjusting the material quality and thickness of the flexible substrate 1, the material quality and thickness of the adhesive layer 6, the thickness of the semiconductor chip 2, and so on. When the electronic device package 10 FD thus obtained is bent, there is almost no strain in the portion where the pad 7 directly contacts the conductor post 5, whereby excellent connection reliability is obtained.

Therefore, the overall bend characteristics and the connection reliability of the electronic device package 10 FD can be maintained.

Furthermore, since the connection section 4a of the metal wiring pattern 4 is electrically connected to the pad 7 with the conductor post 5 in between, and the uncured adhesive layer 6a is deposited while exposing the top face of the conductor post 5 (intermediate structure 5a), when mounting the semiconductor chip 2, it becomes easier to align the pad 7 after connecting it on the connection section 4a. Moreover, since the conductor post 5 consists of a sintered compact of fine metal particles, the connection strength of the connection section 4a and the pad 7 is increased, enhancing the connection reliability. Another advantage is that the flexible substrate 1 and the semiconductor chip 2 can be satisfactorily joined and sealed together, since the adhesive layer 6 is provided between them.

In the method for manufacturing this type of electronic device package, the liquid body for the intermediate structure 5a of the conductor post 5, which is arranged between the connection section 4a of the metal wiring pattern 4 and the pad 7 of the semiconductor chip 2, is baked and its fine metal particles are sintered, enabling the connection section 4a and the pad 7 to be connected and made electrically conductive. Therefore, the extremely thin thickness of the sintered compact of fine metal particles becomes the thickness required for conductive connection, thereby enabling the thickness of the electronic device package obtained to be made thin.

Also, conduction between the connection section 4a and the pad 7 can be maintained by baking and basically without applying pressure to the semiconductor chip 2. Therefore, even an ultra-thin semiconductor chip 2 can be mounted without applying pressure thereto. This avoids trouble such as reduced connection reliability and breakage of the semiconductor chip 2 due to pressure. Therefore, this invention is particularly suitable to be used in the manufacture of super-thin packages in various types of electronic equipment and components (electronic components) thereof.

The post-shaped conductor post 5 is formed on the connection section 4a of the metal wiring pattern 4 by depositing a liquid body made by dispersion of fine metal particles using a droplet ejection method, connecting the connection section 4a to the pad 7 and achieving electrical conduction between them. Therefore, when mounting the semiconductor chip 2, the semiconductor chip 2 can be easily aligned after connecting its pad 7 to the connection section 4a. Moreover, the strength of the connection between the connection section 4a and the pad 7 is increased, achieving a more reliable connection.

Since the metal wiring pattern 4 is formed by a droplet ejection method using a liquid body of dispersed fine metal particles, it can be made sufficiently thin, enabling the thickness of the overall mount structure to be reduced. Productivity can also be increased, since the metal wiring pattern 4 can be formed using the same apparatus that ejects the liquid body for connecting the metal wiring pattern 4 to the pad 7.

Prior to connecting the connection section 4a of the metal wiring pattern 4 to the pad 7 of the semiconductor chip 2 using the liquid body, the adhesive layer 6a of thermosetting insulating resin is deposited with the connection section 4a exposed. Therefore, when the liquid body is baked to achieve connection and conduction, the adhesive layer 6a of thermosetting resin simultaneously cures, achieving a satisfactory connection and seal between the flexible substrate 1 and the semiconductor chip 2; this eliminates the time required for curing and thereby obtains better productivity than when using an underfill to seal them.

In this embodiment, although the conductor post 5 is formed on the connection section 4a of the metal wiring pattern 4 and is used for connection and conduction of the connection section 4a and the pad 7, this should not be considered as limiting the present invention. It would be acceptable to provide a liquid body containing fine metal particles on the connection section 4a and connection the pad 7 directly to this liquid body. In this case, the liquid body could be deposited on the connection section 4a or on the pad 7. In either case, since the liquid body made by dispersion of fine metal particles has good wetness with respect to the connection section 4a or the pad 7 which consists of the same metal, it can be selectively arranged by a droplet ejection method or the like, and satisfactorily applied over the connection section 4a or the pad 7.

A liquid phase method using a liquid body containing fine metal particles is not required to form the conductor post 5, which can be formed by using a metal conductor made by plating and the like; in this case, a liquid body made by dispersion of fine metal particles is arranged on the conductor post, and the pad 7 is connected via this liquid body.

In this embodiment, although the adhesive layer 6 is disposed on the flexible substrate 1 and used in connecting and sealing the flexible substrate 1 to the semiconductor chip 2, the present invention is not limited to this arrangement. For example, the flexible substrate 1 and the semiconductor chip 2 could be sealed together by an underfill material.

Third Embodiment

Figure 5:
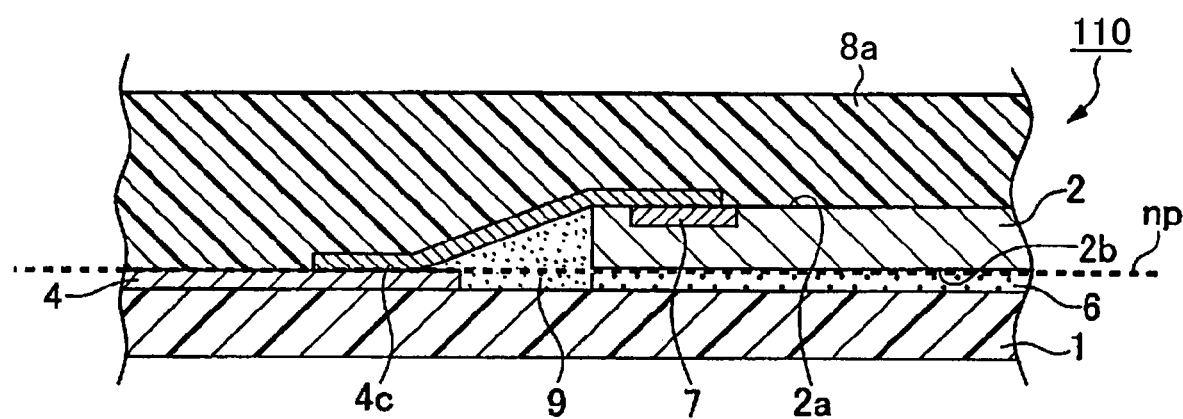
FIG. 5 is a partial cross-sectional structural view of an electronic device package according to a third embodiment.

Subsequently, the configuration of an electronic device package according to a third embodiment of the present invention will be explained with reference to FIG. 5. FIG. 5 is a partial cross-sectional structural view of an electronic device package according to the third embodiment.

In the third embodiment, constituent elements which are the same as those in the preceding embodiments are indicated by the same reference numerals and will not be explained further.

As shown in FIG. 5, an electronic device package 110 includes the semiconductor chip 2 mounted on the flexible substrate 1. Since the flexible substrate 1 consists of a resin such as polyimide, various shapes may be used such as a tape-like or a sheet-like shape.

The metal wiring pattern 4 is formed on the flexible substrate 1, and is connected to the pad 7 of the semiconductor chip 2 via the connection wiring 4c. The adhesive layer 6 of thermosetting insulating resin is formed on the flexible substrate 1, and affixes the flexible substrate 1 to the semiconductor chip 2. For example, an epoxy-type resin material or the like is used as the thermosetting resin for forming the adhesive layer 6.

The semiconductor chip 2 is affixed onto the adhesive layer 6 with its terminal formation face (active face) 2a facing the side of the flexible substrate 1. Since the semiconductor chip 2 is ultra-thin, having a thickness of less than 50 μm in this embodiment, it is mounted with a its terminal formation face 2a, being the active face, facing the opposite side to that of the flexible substrate 1, i.e. by facedown bonding.

The pad 7 of the semiconductor chip 2 is formed, for example, by plating of Ni and Au in that sequence on an unillustrated base layer of an aluminum alloy extracted from an unillustrated integrator circuit inside the semiconductor chip 2. Ag, Cu, Sn, and In, can be used instead of Au for the outermost layer (uppermost layer) which becomes the actual join layer of the pad 7; a laminated layer structure consisting of a plurality of the above may also be used.

A slope member 9 is formed on a side face portion of the semiconductor chip 2, and has a sloping portion extending outwardly from the terminal formation face 2a to the top of the flexible substrate 1. A connection wiring 4c electrically connects the pad 7 to the metal wiring pattern 4 via the top face of the sloping portion of the slope member 9. The connection wiring 4c is formed by a droplet ejection method, and consists of a thin film made by sintering of fine metal particles. The slope member 9 alleviates the step between the terminal formation face 2a of the semiconductor chip 2 and the top face of the flexible substrate 1, and also prevents breakage and the like of the connection wiring 4c which is formed by a droplet ejection method.

The slope member 9 can be formed by using a liquid application means such as a dispenser to coat the top of the flexible substrate 1 with a resin material such as, for example, polyimide resin, silicon-modified polyimide resin, epoxy resin, silicon-modified epoxy resin, benzocyclobutene (BCB), and polybenzoxazole (PBO). Alternatively, it may be formed by droplet ejection or by affixing a dry film.

An insulating layer 8a consisting of an organic insulating material such as acrylic resin or epoxy resin is deposited over the semiconductor chip 2, the metal wiring pattern 4, the connection wiring 4c, and the like, on the flexible substrate 1. The insulating layer 8 functions as a so-called passivation film which protects the metal wiring pattern 4 and the semiconductor chip 2, preventing short-circuiting of the metal wiring pattern 4 due to contact with an external part, erosion of the metal wiring pattern 4 caused by environmental water and reactive gas, and so on. As shown in FIG. 5, the film thickness of the insulating layer 8a differs on the semiconductor chip 2 and the outer side region thereof; in this embodiment, the film is thin on the semiconductor chip 2 and thick on the outside side of the semiconductor chip 2.

The electronic device package 110 of this embodiment configured as described above consists of the thin-layer semiconductor chip 2 mounted on a flexible substrate 1 and can appropriately be used in, for example, attaching to an electronic equipment when bent into a cross-sectional U-shape, and in a controller for a display apparatus having variable electronic parameters and the like, and so on. As shown in FIG. 5, in the electronic device package 110 of this embodiment, the neutral plane (the plane in which the strain ε becomes zero when a bending stress is applied to the electronic device package 110) np substantially matches the terminal formation face 2a of the semiconductor chip 2. That is, the modulus of elasticity in bending of the structural members (the flexible substrate 1, the semiconductor chip 2, the adhesive layer 6, the insulating layer 8a, and so on) which are arranged on both sides of the combustion chamber 2a in the thickness direction of the electronic device package 110 are adjusted to make them substantially equal.

Since the neutral plane np is adjusted such that it matches the mount face 2b of the semiconductor chip 2, the electronic device package 110 of this embodiment has excellent bend resistance. The semiconductor chip 2 is an ultra-thin electronic device which has been thinned to a thickness of less than substantially 50 μm by grinding the semiconductor substrate from the opposite side to that of the normal terminal formation face (active face) 2a. The grinding means used, such as sandstone, sometimes causes minute cracks (grind cracks) in the mount face 2b of the semiconductor chip 2. While these grind cracks do not affect the operation of the semiconductor chip 2 itself, in an electronic device package which bends during use such as that of this embodiment there is a danger that the grind cracks may increase when the semiconductor chip 2 elastically deforms, damaging the chip. Accordingly in this embodiment, material quality and/or the thickness of the components is/are adjusted such that the mount face 2b of the semiconductor chip 2 and the neutral plane np of the electronic device package 110 substantially match. This reduces the strain when the electronic device package 110 is bent to almost zero, and effectively prevents increase of grind cracks due to bend stress.

In the electronic device package 110 shown in FIG. 5, the modulus of elasticity in bending of the laminated structure consisting of the adhesive layer 6 and the flexible substrate 1 which are arranged on the lower side of the terminal formation face 2a as viewed in the diagram, and the modulus of elasticity in bending of the laminated structure consisting of the semiconductor chip 2 and the insulating layer 8a, are adjusted so that they are almost equal. The modulus of elasticity in bending can be adjusted by adjusting the Young modulus and the thickness of the flexible substrate 1 and the adhesive layer 6.

In this embodiment, effects of the modulus of elasticity in bending of the metal wiring pattern 4 are almost completely eliminated since it is formed by a droplet ejection method and is made extremely thin.

In the electronic device package 110 of this embodiment, the neutral plane of the electronic device package in the outer side region of the semiconductor chip 2 should preferably be aligned in a single plane with the terminal formation face 2a of the semiconductor chip 2. When the position of the neutral plane differs according to the location on the electronic device package, the size of the displacement varies according to location when the electronic device package is bent, and it becomes impossible to obtain even bend characteristics; there is also a danger that a large local load may be applied.

As shown in FIG. 5, in the outer side region of the semiconductor chip 2, the metal wiring pattern 4 and the insulating layer 8 are laminated on the flexible substrate 1, and the neutral plane np is positioned in the insulating layer 8a in alignment with the terminal formation face 2a. Therefore, the modulus of elasticity in bending for adjusting the position of the neutral plane can be adjusted by adjusting the thickness of the insulating layer 8a.

As described above, the electronic device package 110 of this embodiment has a neutral plane which substantially matches the terminal formation face 2a of the semiconductor chip 2, and consequently there is almost no strain in the terminal formation face 2a when the substrate is bent. This obtains a highly reliably electronic device package which has excellent resistance to bend stress in the conductive connection portion between the semiconductor chip 2 and the metal wiring pattern 4.

Method for Manufacturing the Electronic Device Package

Next, a method for manufacturing the electronic device package 110 according to the third embodiment shown in FIG. 5 will be explained with reference to FIG. 6.

Figure 6A:
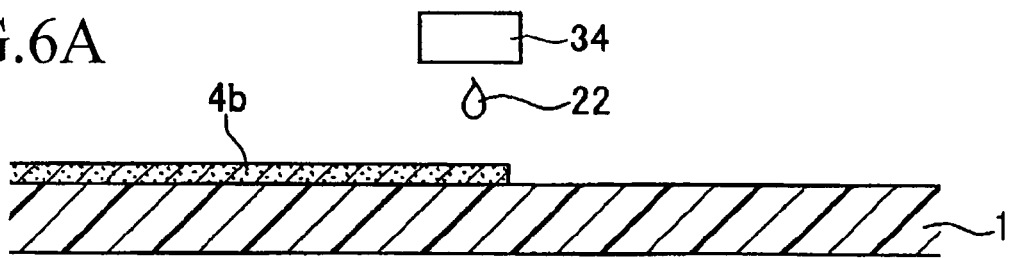
FIGS. 6A to 6E are cross-sectional structural views of a method for manufacturing the electronic device package according to the third embodiment.

Firstly, a droplet ejection method is used to eject a liquid substance, which is made by dispersion of fine metal particles into a dispersion liquid, at a predetermined position on a flexible substrate 1 such as that shown in FIG. 6A. While it is possible to use an inkjet method, a dispenser method, and such like, as the droplet ejection method, this embodiment uses the inkjet method as in the preceding embodiment, which is preferable since it enables a desired amount of the liquid substance to be deposited at a desired position.

In this embodiment, as shown in FIG. 6A, a droplet 22 of a liquid body made by using fine silver particles as the fine metal particles is ejected from the droplet ejection head 34 and dropped onto a point on the flexible substrate 1 where the wiring is to be formed, forming an intermediate structure 4b which will become the metal wiring pattern 4 after baking. In this embodiment, the intermediate structure 4b indicates the liquid dropped onto the substrate and the dry substance of this liquid. In the apparatus which ejects the liquid body, the amount of overlap between consecutively ejected droplets should preferably be controlled in order to prevent bulging. It is also possible to use an ejection method which separately ejects a plurality of droplets so that they do not touch each other in a first ejection, and then fills the gaps between them in second and subsequent ejections.

Figure 6B:
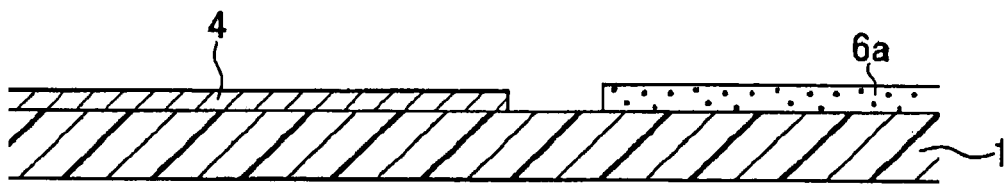

After the intermediate structure 4b of the metal wiring pattern 4 has been formed in this way, it is heated at substantially 200° C., and the fine metal particles (fine silver particles) are sintered to obtain the metal wiring pattern 4 shown in FIG. 6B. Incidentally, instead of the main curing process of sintering the fine metal particles (fine silver particles), the intermediate structure 4b of the metal wiring pattern 4 may be confined to a provisional curing process of merely vaporizing the dispersion liquid in the liquid body.

Figure 6C:
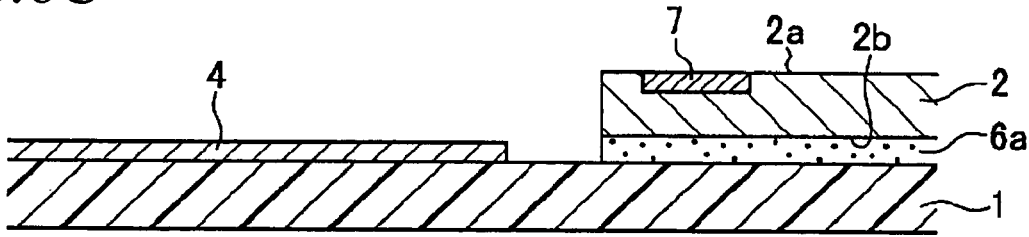

Next, the thermosetting resin is applied over the flexible substrate 1 to form an uncured adhesive layer 6a as shown in FIG. 6C. There are no particular limitations on the method for applying the thermosetting resin, it being possible to use a conventional application method such as roll-coating, droplet ejection, and so on. Although in this embodiment, the adhesive layer 6a does not overlap with the metal wiring pattern 4, it may partially overlap with the end of the metal wiring pattern 4 on the substrate center side. In this case, the connection wiring 4 is arranged on the bottom side (the flexible substrate 1 side) of the semiconductor chip 2 which is attached via the adhesive layer 6. In this configuration, if a connection terminal is disposed on the mount face 2b of the semiconductor chip 2, the metal wiring pattern 4 and the connection terminal on the mount face 2b can be connected in the mount region of the semiconductor chip 2.

Figure 6D:
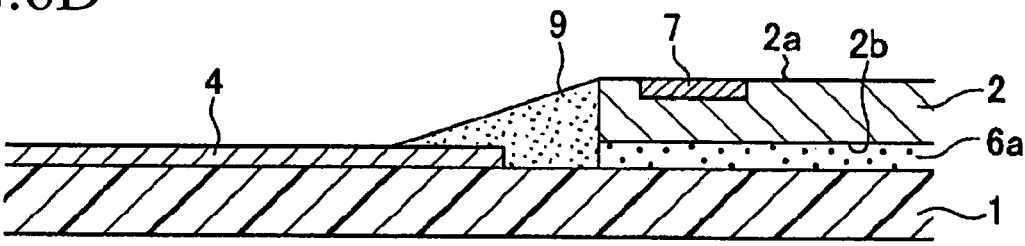

The semiconductor chip 2 is then positioned on the uncured adhesive layer 6a, and mounted so as to overlap with the adhesive layer 6a in one plane as shown in FIG. 6C. Next, as shown in FIG. 6D, a slope member 9 is formed in order to alleviate the step between the terminal formation face 2a of the semiconductor chip 2 and the metal wiring pattern 4. This slope member 9 can be formed by using a liquid application means such as a dispenser to apply a resin material such as, for example, polyimide resin, silicon-modified polyimide resin, epoxy resin, silicon-modified epoxy resin, benzocyclobutene (BCB), polybenzoxazole (PBO), and the like. As shown in FIG. 6D, the slope member 9 becomes thinner as it extends from a side face of the semiconductor chip 2 toward the outer side, and slopes down from the terminal formation face 2a of the semiconductor chip 2 to the metal wiring pattern 4. Alternatively, part of the slope member 9 may extend along the terminal formation face 2a as long as it does not cover the pad 7.

Figure 6E:
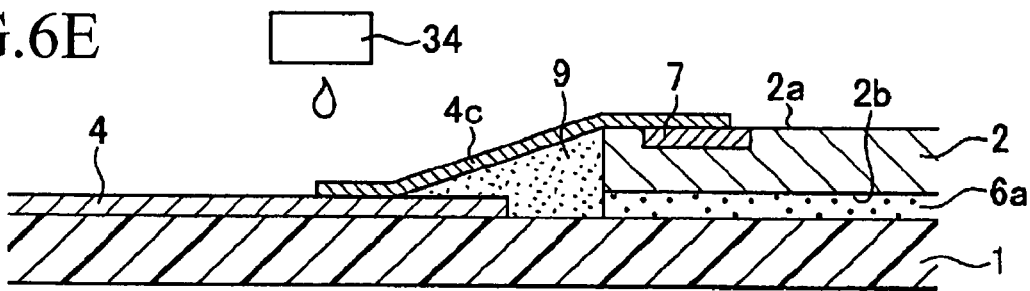

As shown in FIG. 6E, the connection wiring 4c is then formed. The connection wiring 4c extends from the top face of the pad 7 formed on the terminal formation face 2a, along the sloping face of the slope member 9, and onto the metal wiring pattern 4. The connection wiring 4c can be formed by the same method as the metal wiring pattern 4. As shown specifically in FIG. 6E, a droplets of a liquid body containing fine metal particles (fine silver particles) are selectively ejected from the droplet ejection head 34 at predetermined positions on the substrate, then dried and baked to produce the metal wiring.

When the connection wiring 4c is baked, the adhesive layer 6a is simultaneously cured to produce the adhesive layer 6 which is used in securely attaching the mount face 2b of the semiconductor chip 2 to the flexible substrate 1. The insulating layer 8a is disposed so as to cover the semiconductor chip 2 and the metal wiring pattern 4, obtaining the electronic device package 110 having the mount structure shown in FIG. 5.

When curing the intermediate structure 4b of the metal wiring pattern 4 by the provisional curing process instead of the main curing process, the fine metal particles of the connection section 4a are sintered while baking the connection wiring 4c.

When manufacturing the electronic device package 110 obtained by the above processes, the neutral plane of the electronic device package 110 is made to substantially match the terminal formation face 2a of the semiconductor chip 2 by appropriately selecting/adjusting the material quality and thickness of the flexible substrate 1, the material quality and thickness of the adhesive layer 6, the thickness of the semiconductor chip 2, and so on. When the electronic device package 110 thus obtained is bent, there is almost no strain in the mount face 2b, where there is a possibility of grind cracks. This effectively prevents damage to the semiconductor chip 2 and achieves excellent reliability.

Due to the structure which electrically connects the metal wiring pattern 4 to the pad 7 via the connection wiring 4c, conduction between the connection section 4a and the pad 7 can be maintained by baking and basically without applying pressure to the semiconductor chip 2. Therefore, for example, even an ultra-thin semiconductor chip 2 can be mounted without applying pressure thereto. This avoids trouble such as reduced connection reliability and breakage of the semiconductor chip 2 due to pressure. Therefore, this invention is particularly suitable to be used in the manufacture of super-thin packages in various types of electronic equipment and components (electronic components) thereof.

Since the metal wiring pattern 4 and the connection wiring 4c are formed by a droplet ejection method using a liquid body of dispersed fine metal particles, they can be made sufficiently thin, enabling the thickness of the overall mount structure to be reduced. Productivity can also be increased, since the metal wiring pattern 4 and the connection wiring 4c can be formed using the same droplet ejection apparatus.

Prior to connecting the connection section 4a of the metal wiring pattern 4 to the pad 7 of the semiconductor chip 2 using the liquid body, the adhesive layer 6a of thermosetting insulating resin is deposited on the bottom side of the semiconductor chip 2. Therefore, when the liquid body is baked to achieve connection and conduction, the adhesive layer 6a of thermosetting resin cures simultaneously, achieving a satisfactory connection and seal between the flexible substrate 1 and the semiconductor chip 2; this eliminates the time required for curing and thereby obtains better productivity than when using an underfill to seal them.

Electronic Equipment

Figure 7A:
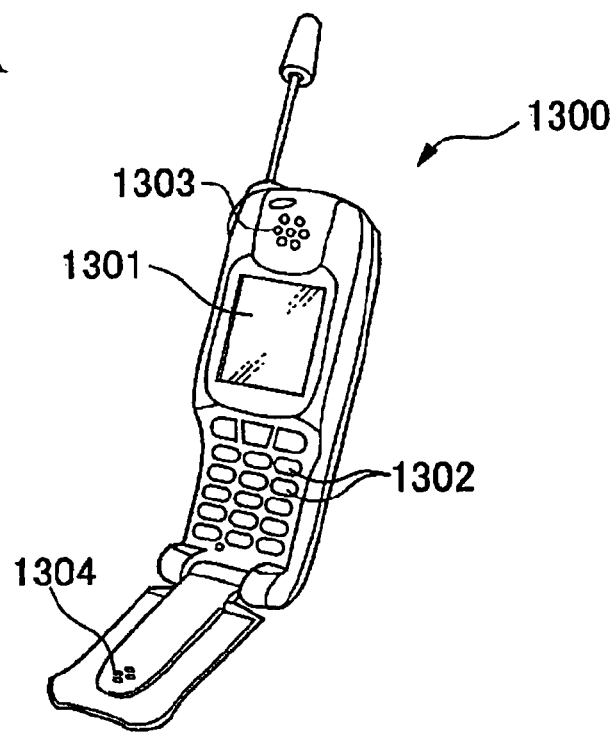
FIGS. 7A and 7B are perspective structural views of an example of an electronic equipment having a display section fitted thereto.

FIG. 7A is a perspective view of an example of an electronic equipment according to this invention. A mobile telephone 1300 shown in FIG. 7A includes an electronic device package produced using the method described above, fitted inside a case or to a display section 1301. In FIG. 7A, reference numeral 1302 represents a control button, reference numeral 1303 represents an earpiece, and reference numeral 1304 represents a mouthpiece.

Figure 7B:
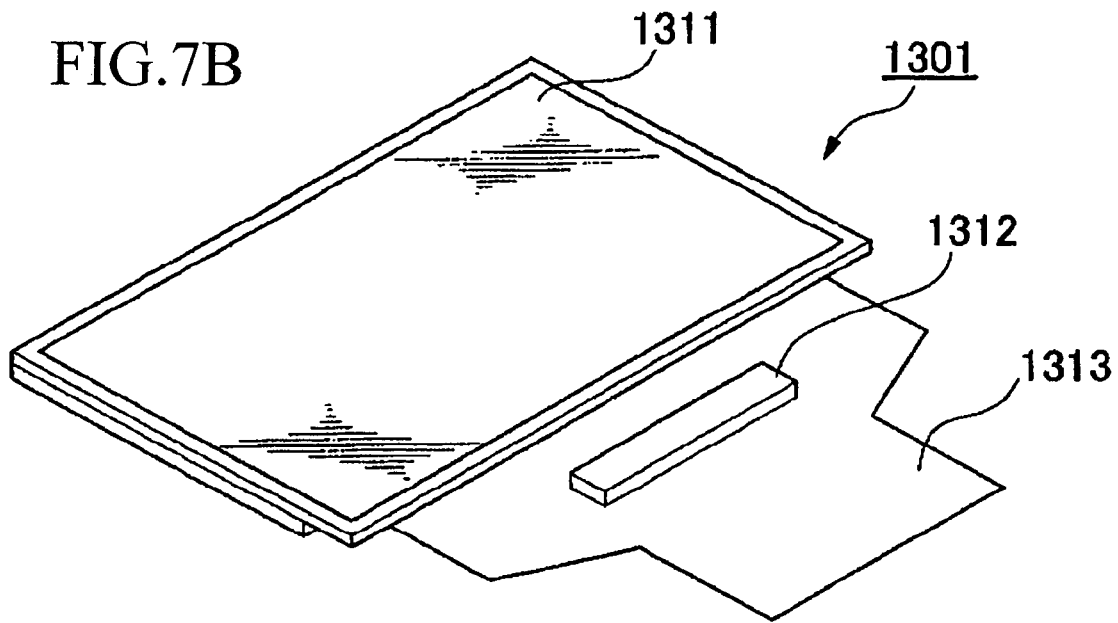

FIG. 7B is a perspective structural view of the display section 1301 shown in FIG. 7A. The display section 1301 is constructed by mounting an electronic device 1312 on an electronic device package 1313, which is then connected to one end of a display panel 1311 consisting of a liquid crystal display apparatus or an organic display apparatus. An electronic device package on which an electronic is mounted using the mount method of this invention is appropriate for use as the electronic device package 1313. The electronic device is mounted thinly on the electronic device package, enabling the mobile telephone 1300 to be made small and light.

The electronic device package of this embodiment is not limited to the above mobile telephone, and can be applied in various types of electronic equipment such as electronic books, personal computers, digital still cameras, liquid crystal televisions, viewfinder-type or monitor direct view-type video tape recorders, car navigation apparatuses, pagers, electronic notebooks, calculators, word processors, work stations, television telephones, POS terminals, and equipment fitted with touch panels. Application of the electronic device package of this invention enables any type of electronic equipment to be made thin and small. The electronic device package of this embodiment is not limited to a liquid crystal apparatus, and can be appropriately applied as a component and the like in electronic equipment such as electromagnetic optical apparatuses including an organic electroluminescent (EL) apparatus, a plasma display panel (PDP), a field emission display (FED), and so on.

What is claimed is:

1. An electronic device package comprising:
   a flexible substrate having a wiring pattern formed thereon;
   an electronic device having a terminal formation face on which a connection terminal is provided and a side face;
   a slope member formed on the side face of the electronic device, the slope member having a sloping face which extends outwardly from the side face; and
   a connection wiring directly contacting the sloping face, electrically connecting the connection terminal to the wiring pattern, and having a connection surface at which the connection wiring and the connection terminal are connected, wherein
   the electronic device is mounted with the terminal formation face facing opposite to the flexible substrate, and the connection surface of the connection wiring is substantially aligned in a neutral plane of bending in a thickness direction of the electronic device package.

2. The electronic device package according to claim 1, comprising:
   a first component group including the flexible substrate and arranged on one side of the terminal formation face in the thickness direction of the electronic device package; and
   a second component group including the electronic device and arranged on the other side of the terminal formation face, wherein
   a modulus of elasticity in bending of the first component group and a modulus of elasticity in bending of the second component group are substantially the same.

3. The electronic device package according to claim 1, comprising:
   an insulating layer covering the electronic device;
   a first component group including the flexible substrate and the electronic device and arranged on one side of the terminal formation face in the thickness direction of the electronic device package; and
   a second component group including the insulating layer and arranged on the other side of the terminal formation face, wherein
   a modulus of elasticity in bending of the first component group and a modulus of elasticity in bending of the second component group are substantially the same.

4. The electronic device package according to claim 1, wherein a neutral plane of bending of the electronic device package in an outer side of the electronic device in a thickness direction of the electronic device package is substantially aligned in a single plane with the terminal formation face.

5. The electronic device package according to claim 1, comprising:
an insulating layer formed on the flexible substrate and in a region outside the electronic device, and covering the wiring pattern.

6. The electronic device package according to claim 5, wherein the insulating layer is also formed on the electronic device.

7. An electronic equipment comprising an electronic device package according to claim 1.

8. An electronic device package comprising:
a flexible substrate having a wiring pattern formed thereon,
an electronic device having a terminal formation face on which a connection terminal is provided, a side face, and a mount face on an opposite side of the terminal formation face;
a slope member formed on the side face of the electronic device, the slope member having a sloping face which extends outwardly from the side face; and
a connection wiring directly contacting the sloping face, and electrically connecting the connection terminal to the wiring pattern, wherein
the electronic device is arranged with the terminal formation face facing opposite to the flexible substrate, the mount face is ground by grinding so as to reduce a thickness of the electronic device, and the mount face is substantially aligned in a neutral plane of bending in a thickness direction of the electronic device package.

9. The electronic device package according to claim 8, comprising:
a first component group including the flexible substrate and arranged on one side of the mount face in the thickness direction of the electronic device package; and
a second component group including the electronic device and arranged on the other side of the mount face, wherein
a modulus of elasticity in bending of the first component group and a modulus of elasticity in bending of the second component group are substantially the same.

10. The electronic device package according to claim 8, comprising:
an insulating layer arranged on the flexible substrate and in a region outside the electronic device, wherein the insulating layer covers the wiring pattern.

11. The electronic device package according to claim 10, wherein the insulating layer is also formed on the electronic device.

12. The electronic device package according to claim 8, wherein a neutral plane of bending of the electronic device package in an outer side of the electronic device in a thickness direction of the electronic device package is substantially aligned in a single plane with the mount face.

13. An electronic equipment comprising an electronic device package according to claim 8.

* * * * *